United States Patent [19]

Hanawa

[11] Patent Number: 4,887,035

[45] Date of Patent: Dec. 12, 1989

[54] MAGNETIC RESONANCE SPECTROSCOPY SYSTEM

[75] Inventor: Masatoshi Hanawa, Ootawara, Japan

[73] Assignee: Kabushiki Kaisha Toshiba, Kawasaki, Japan

[21] Appl. No.: 218,277

[22] Filed: Jul. 13, 1988

[30] Foreign Application Priority Data

Jul. 15, 1987 [JP] Japan ................................. 62-176835

[51] Int. Cl.$^4$ ............................................. G01R 33/20
[52] U.S. Cl. ..................................... 324/309; 324/307
[58] Field of Search ....................... 324/307, 309, 306; 128/653

[56] References Cited

U.S. PATENT DOCUMENTS 4,733,186  3/1988  Oppelt et al. ........................ 324/309
4,737,714  4/1988  Hanawa ............................... 324/309

*Primary Examiner*—Tom Noland
*Assistant Examiner*—Kevin D. O'Shea
*Attorney, Agent, or Firm*—Foley & Lardner, Schwartz, Jeffery, Schwaab, Mack, Blumenthal & Evans

[57] ABSTRACT

A magnetic resonance spectroscopy system repeatedly performs operations of selectively exciting, using a 90° pulse, first two regions which sandwich a local region therebetween in the direction of one of the X axis and y axis for a slice portion, subsequently erasing transverse magnetization components in the first two regions, selectively exciting, using a 90° pulse, second two regions which sandwich the local region therebetween in the direction of the other of the x axis and y axis, subsequently erasing transverse magnetization components in the second two regions, exciting a region having one local region in the z-axis direction to acquire magnetic resonance data therefor, and exciting a region including another local region in the z-axis direction to acquire magnetic resonance data therefor within a repetition time.

9 Claims, 5 Drawing Sheets

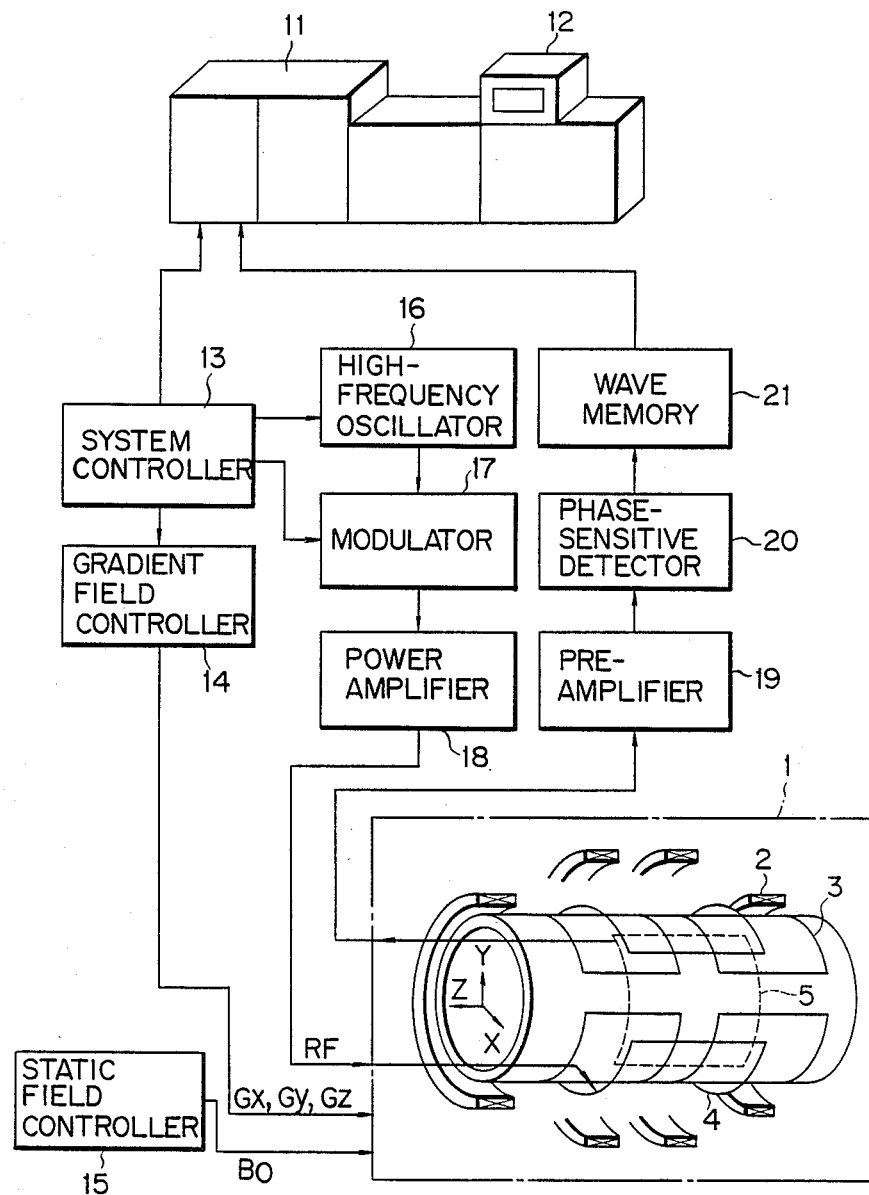
F I G. 4

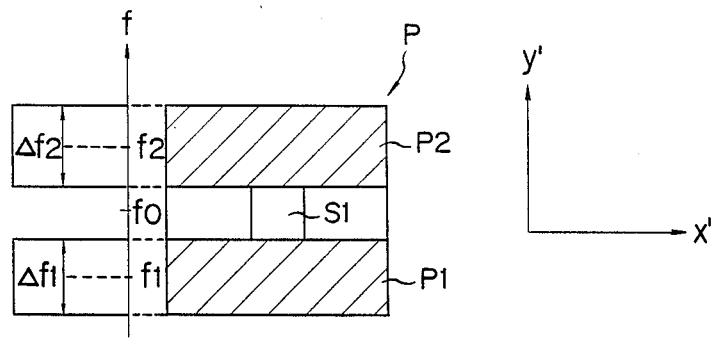
F I G. 6
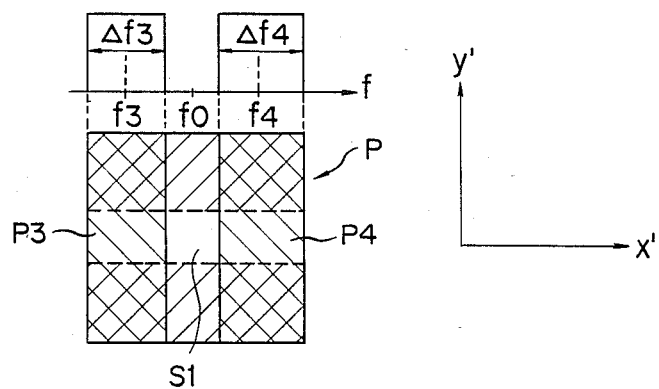
F I G. 7

MAGNETIC RESONANCE SPECTROSCOPY SYSTEM

BACKGROUND OF THE INVENTION

1. Field of the Invention

The present invention relates to a magnetic resonance spectroscopy (MRS) system for obtaining magnetic resonance (MR) spectrum information of specific atomic nuclei existing within an object under examination utilizing a magnetic resonance phenomenon.

2. Description of the Related Art

In the magnetic resonance imaging (MRI) system, a uniform static magnetic field is applied to a predetermined portion of an object under examination. Furthermore, to the object applied are a gradient magnetic field orthogonal to a slice portion including a portion of interest and an excitation pulse which is a high-frequency (usually a radio frequency) magnetic field orthogonal to the static magnetic field. The gradient magnetic field and the excitation pulse are superimposed on the static magnetic field. As a result, magnetic resonance is induced in specific nuclear spins within the slice portion only. With the system, after the removal of the high-frequency magnetic field, a magnetic resonance (MR) signal is detected from the resonant nuclei, and MR data based on the MR signal is processed to form a magnetic resonance (MR) image.

In a conventional system, as shown in FIG. 1, it was usual to obtain an MR signal for a slice S of an object P under examination and to form an MR image for the slice S. Recently, on the other hand, extracting an MR signal from only a local region S1 including a target portion in the slice S shown in FIG. 1 for subsequent spectrum analysis and acquiring MR spectrum information mirroring information on the density of specific nuclear spins and chemical shifts have been demanded especially in the field of medical diagnosis. Such a system as acquiring MR spectrum information is called the MRS system and incorporated in an MRI system, for example.

To detect the MR signal of such a local region only, two types of method have been used.

According to the first method, a portion of a uniform magnetic field Bo' is locally created in a static magnetic field Bo as shown in FIG. 2, and the MR phenomenon is caused to occur only in the portion to detect an MR signal. The method is referred to as the topical magnetic resonance (TMR) method.

The second method is called the surface coil method. When a relatively small coil, called a surface coil, is disposed over the surface of a target portion of an object under examination, a phenomenon occurs in which the sensitivity D (in the direction of depth) for a received MR signal detected by the coil becomes maximum (sensitivity D1) at the center of the x axis as shown in FIG. 3. Thus, the second method acquires partial MR information by detecting the MR signal from the central region.

However, these conventional methods involve problems to be solved. That is, in the case of the TMR method, in order to alter the distribution of the static magnetic field, the range of current applied to a coil and/or the position of the object under examination must be changed. This will result in complexity of the system. The surface coil method has considerable effect in receiving the MR signal from the surface and its vicinities of an object under examination, but cannot be applied to deep portions of the object.

SUMMARY OF THE INVENTION

It is an object of the present invention to provide an MRS system capable of acquiring data of plural local regions in a short time without need of any complexed arrangement.

The present invention concerns with an MRS system arranged to detect MR signals of predetermined local regions within an object under examination and to perform MR spectroscopy analysis on the basis of the MR signals. In accordance with the present invention, to solve the above problems, the magnetic resonance spectroscopy system repeatedly performs operations of: selectively exciting, using a 90° pulse, first two regions sandwiching a local region therebetween in the direction of one of the x axis and y axis for at least a predetermined portion; subsequently erasing transverse magnetization components in the first two regions; selectively exciting, using a 90° pulse, second two regions sandwiching the local region therebetween in the direction of the other of the x axis and y axis; subsequently erasing transverse magnetization components in the second two regions; exciting a region including one local region in the z-axis direction to acquire magnetic resonance data therefor; and exciting a region including another local region in the z-axis direction to acquire magnetic resonance data therefor within a repetition time of the excitation.

First, in applying to the object a 90° pulse and a slicing gradient magnetic field for tipping the magnetization into one of the x-axis and y-axis directions, regions other than the local region are selectively excited, and subsequently the transverse magnetization components in the regions are erased. Next, in applying to the object a 90° pulse and a slicing gradient magnetic field for tipping the magnetization into the other axis-direction, other two regions in the other axis-direction are selectively excited and then the transverse magnetization components are erased. Thereafter, a plurality of local regions in the z-axis direction are in sequence excited to acquire MR signals from these local regions.

BRIEF DESCRIPTION OF THE DRAWINGS

FIG. 4 a block diagram of a system embodying the present invention;

FIGS. 6, 7 and 8A–8C are diagrams useful for explaining the operation of the system of FIG. 4.

DETAILED DESCRIPTION OF THE PREFERRED EMBODIMENTS

Figure 1:
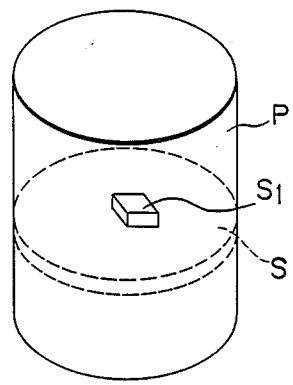
FIG. 1 is a diagram used for explaining the acquisition of MR data of a local region in an existing system.
Figure 2:
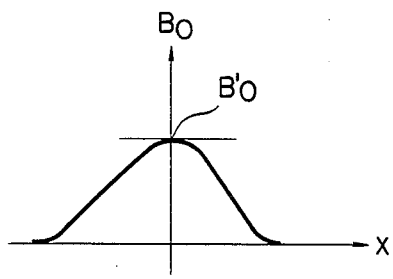
FIG. 2 is a diagram used for explaining the TMR method used in an existing system.
Figure 3:
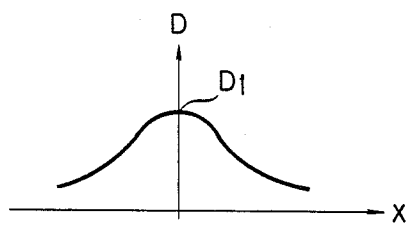
FIG. 3 a diagram used for explaining the surface coil method in an existing system.
Figure 5:
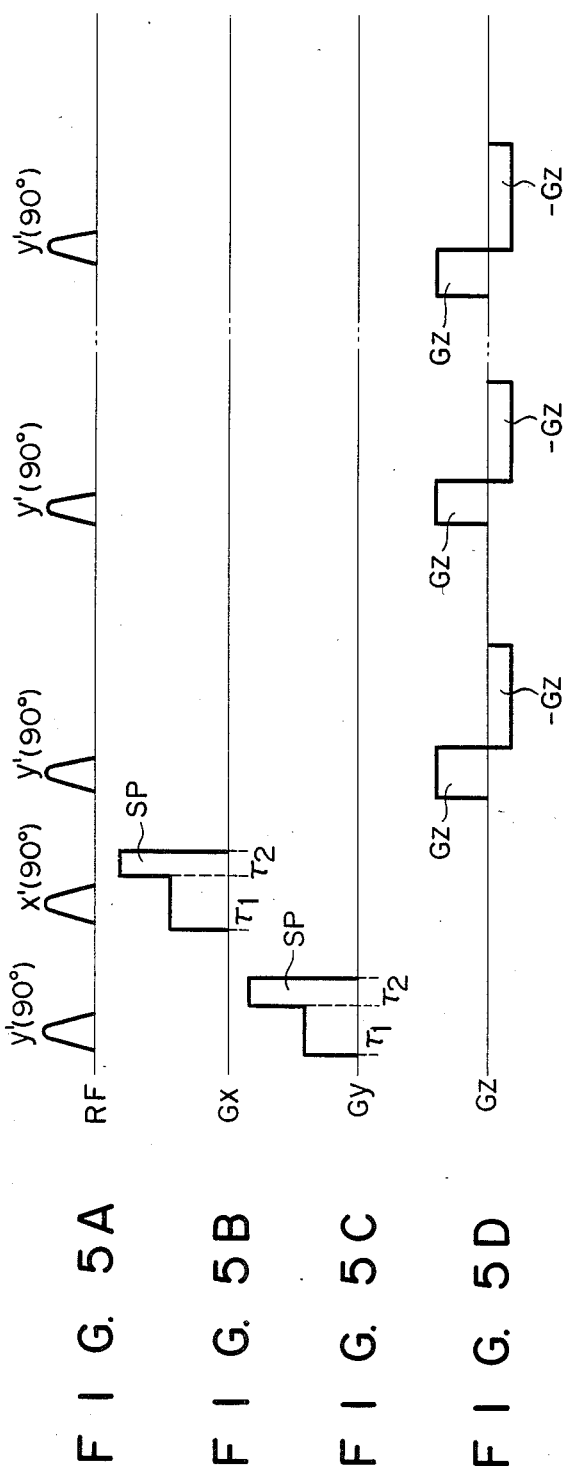
FIGS. 5A through 5D are a timing diagram showing a pulse sequence for exciting magnetic resonance in the system of Fig 4.

An MRS system according to an embodiment of the present invention will be described with reference to FIG. 4.

A magnet assembly 1 comprises a static magnetic field coil system 2, a gradient field coil system 3, an excitation coil system 4 and a detection coil system 5. Static magnetic field coil system 2 is used for applying a main magnetic field being a static magnetic field of a predetermined strength to an object under examination placed within magnet assembly 1. Gradient magnetic field coil system 3 is used for applying gradient magnetic fields in the x, y, and z directions to the object. Excitation coil system 4 is used for applying high-frequency pulses, e.g., 90° selective pulses or a 90° pulse and a 180° pulse to the object so as to excite nuclear spins within a predetermined portion of the object to induce magnetic resonance therein. Detection coil system 5 is used for detecting an MR signal produced in the object.

A display 12 and a system controller 13 are coupled to a data processor, or computer 11. A gradient field controller 14 and a modulator 17 are coupled to controller 13. Gradient field controller 14 is coupled to gradient field coil system 3 for causing coil system 3 to form the gradient fields and for controlling these fields. Gradient field controller 14 controls the on/off of currents to be applied to gradient field coil system 3 and/or controls the magnitudes of these currents, thereby controlling the gradient fields applied to the object. A static field controller 15 is coupled to static field coil system 2 for forming the static field therein. Static field controller 15 controls a current applied to static field coil system 2 so that static magnetic field Bo of a predetermined strength may be applied to the object.

An output signal of a high-frequency oscillator 16 is modulated in modulator 17 and then applied to a power amplifier 18 which is coupled to excitation coil system 4. Detection coil system 5 is coupled to a phase-sensitive detector 20 via a preamplifier 19. Phase-sensitive detector 20 is coupled to a waveform memory 21 which is in turn coupled to data processor 11.

System controller 13 generates and applies timing signals necessary for acquiring MR data as observational data for an MR signal to gradient field controller 14 and modulator 17 so as to control a forming sequence of gradient fields Gx, Gy, Gz and a high-frequency pulse RF.

System controller 13 also controls high-frequency oscillator 16 for causing a high-frequency signal to be produced therefrom. System controller 13 further controls the frequency of the high-frequency signal. Modulator 17 amplitude-modulates the high-frequency signal provided from high-frequency oscillator 16 with a predetermined modulating signal from system controller 13, thereby producing a high-frequency pulse having predetermined frequency components and a predetermined envelope at a specified time. Power amplifier 18 amplifies the high frequency pulse provided from modulator 17 so that it may be applied to excitation coil system 4.

Preamplifier 19 amplifies the MR signal detected by detection coil system 5. Phase-sensitive detector 20 detects the amplified MR signal. Waveform memory 21 stores waveform data detected by phase-sensitive detector 20.

Data processor 11 controls the operation of system controller 13 and receives timing information therefrom. Data processor 11 reads the MR data from waveform memory 21 and processes this MR data so that it may be MR spectrum analyzed. In addition, data processor 11 can display operational information on display 12 as needed by an operator.

The high-frequency signal produced by high-frequency oscillator 16 may comprise components of a central frequency of which correspond to the central position of a local region of the object, and differing frequencies f1, f2, f3, and f4 between which the central frequency of is set. Controller 13 controls high frequency oscillator 16 so that it selects at least part of the frequency components, and modulator 17 controls the envelope and frequency range of the high-frequency signal output by high frequency oscillator 16.

Of gradient field signals for producing gradient magnetic fields Gx and Gy, gradient field controller 14 can produce a signal which abruptly varies from a level corresponding to the predetermined strength of the gradient fields to a level corresponding to the sufficient strength of the gradient fields.

Next, the operation of the MRS system for obtaining MR information about a particular portion of an object under examination will be described with reference to FIGS. 5A through 8C. In these drawings, FIGS. 5A through 5D are timing diagrams representing a pulse sequence used with the apparatus, and FIGS. 6, 7, 8A through 8C schematically illustrate scan formats for acquiring MR data of the object.

Static field coil system 2 is supplied with an excitation current from static field controller 15 for producing a uniform static field Bo in the direction of the z axis. Because of the static field Bo in the Z axis direction, a magnetization produced in the object (positioned within coil assembly 1) is also directed in the z-axis direction. Subsequently, high-frequency oscillator 16, modulator 17, power amplifier 18, and gradient field controller 14 apply magnetic fields to the object to specify the direction of the magnetization and the position of the slice portion therein. This will be described in detail hereinafter. For convenience, the rotatory coordinate system having x', y' and z' axes is used in the following description.

In order to tip the magnetization 90° in the -x' direction thereof according to the rotatory coordinate system, a selective excitation 90° pulse is applied to the object as the high-frequency pulse RF in the y' direction as shown in FIG. 5A. At the same time, a gradient magnetic field Gy is applied in the y-axis direction for the slice as shown in FIG. 5C. The high frequency pulse RF involves two carriers f1 and f2 having different frequencies. It is assumed that, as shown in FIG. 6, a region S1 containing a target local region (whose MR information is to be obtained) is located in the central portion of the object P. If the particular frequencies for exciting the local region S1 are centered at of, then two frequencies corresponding to regions P1 and P2 located on either side of region S1 are f1 and f2. By using the high frequency pulse RF containing the frequencies f1 and f2, the regions P1 and P2 can be selected. Each of the frequencies f1 and f2 are a center frequency, and the frequency bands are determined by Δf1 and Δf2. As described above, the fact that different frequencies may be used to select different regions within the object P is apparent from the following expression:

$$fo = (\gamma/2\pi) \times Bo \qquad (1)$$

wherein $\gamma$ is the gyromagnetic ratio, and Bo is the strength of the magnetic field at its center position.

As the gradient field Gy, a slicing magnetic field of normal strength is applied to the object during a predetermined time $\gamma 1$ and, after the slicing field has been applied (that is, after the completion of the slicing), a magnetic field SP having a much greater strength is applied to the object during a predetermined time $\gamma 2$.

The succeeding magnetic field SP is referred to as a spoiler. The transverse magnetization components associated with the magnetic resonance induced in selectively excited regions P1 and P2 are scattered and erased by the spoiler SP.

The widths (slice widths) Δt1 and Δt2 of the regions P1 and P2 in the y-axis direction are given by $$\Delta t1 = \Delta f1/(\gamma/2\pi)Gy \qquad (2)$$

$$\Delta t2 = \Delta f2/(\gamma/2\pi)Gy \qquad (3)$$

Next, the selection of the regions P3 and P4 which sandwich the local region S1 therebetween in the x'-axis direction, is carried out in a similar manner to the above and will now be described.

In order to tip the magnetization 90° in the y'-axis direction thereof according to the rotatory coordinate system, a high-frequency pulse consisting of a selective excitation 90° pulse is applied to the object in the x'-axis direction, and a slicing gradient magnetic field Gx is simultaneously applied thereto. In this case too, a high-frequency pulse RF is used which has components (Δt3 and Δt4 in frequency band) of frequencies f3 and f4 for the regions P3 and P4 with the frequency fo for the center position of the region containing the target portion being disposed between f3 and f4. The gradient magnetic field Gx is such that it has the normal strength when applied as the slicing field during a first period of τ1 and a much greater strength when applied as a spoiler SP during a period of τ2 immediately following the first period. Accordingly, after regions P3 and P4 have been excited the transverse magnetization components are erased.

Figure 8A:
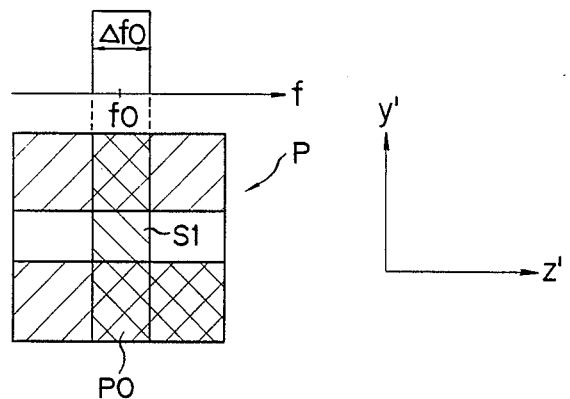

After a predetermined time has elapsed, a high-frequency pulse RF consisting of a selective excitation 90° pulse of a frequency band Δof centered at the frequency fo is applied to the object in the y'-axis direction as shown in FIG. 5A, and a gradient magnetic field Gz is simultaneously applied to the object in the z-axis direction as shown in FIG. 5D. As a result, only the central region Po shown in FIG. 8A is excited. At this time, the transverse magnetization components have already been erased in the regions P1, P2, P3, P4 within the slice portion (whose thickness is determined by Δfo) normal to the z-axis. Therefore, magnetic resonance is only induced in the local region S1 containing the target portion. Subsequently, a refocussing gradient magnetic field -Gz is applied as shown in FIG. 5D.

As described above, since the magnetic resonance can only be induced in the local region S1, only MR data representing the local region S1 is acquired.

Next, MR data for another local region is acquired during the repetition time of excitation of the local region.

Figure 8B:
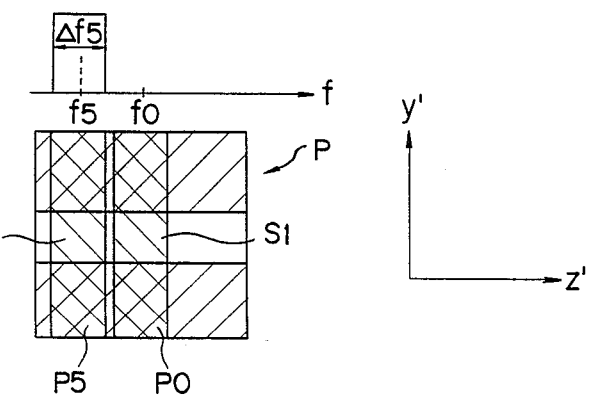
Figure 8C:
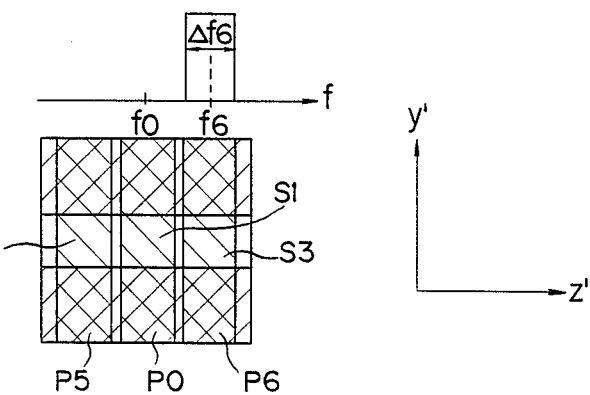

That is, as shown in FIG. 8B, a high-frequency pulse RF consisting of a 90° selective excitation pulse having a frequency band involving a frequency f5 is applied to the object in the y'-axis direction, and a gradient magnetic field Gz is simultaneously applied to the object in the z-axis direction thereof as shown in FIG. 5D. As a result, only a region P5 shown in FIG. 8B is excited so that magnetic resonance is only induced in local region S2. Subsequently, a refocussing gradient magnetic field -Gz is applied to the object as shown in FIG. 5D. In this manner magnetic resonance can be induced in only the local region S2 so that MR data only representing region S2 is aquired. Similarly, a 90° selective excitation RF pulse having a frequency band Δf6 involving a frequency f6 as shown in FIG. 8C is applied in the y'-direction, and, at the same time, a gradient magnetic field Gz is applied in the z-axis direction as shown in FIG. 5D. Consequently, only a region P6 shown in FIG. 8B is excited so that the magnetic resonance is induced only in a local region S3. Subsequently, a refocussing gradient magnetic field -Gz is applied. Thus, the MR data for the local region only can be acquired.

By repeating such operations it is possible to obtain the MR data for the local regions S2, S3, . . . while waiting for the restoration of the magnetization resonated by the excitation of the local region S1. Usually, to obtain the MR data on one local region, data is acquired over several tens of times and then averaged for the improvement of signal-to-noise ratio. It will take, therefore, a long time to acquire MR data on a plurality of local regions without application of the system of the present invention. According to the present invention, it is possible to obtain the MR data on plural regions S2, S3, . . . within substantially the same time as that required to acquire the MR data on one local region S1.

An MR echo signal is detected by detection coil system 5, and the detected echo signal is applied, via preamplifier 19, to phase-sensitive detector 20 to be detected. The result of the detection is entered via waveform memory 21 into data processor 11 where the MR spectrum analysis of the local regions is made.

With the present system, as described above, data on a plurality of local regions including desired local portions within an object under examination can be acquired within a short time under the control of system controller 13, and MR spectrum information on the local regions is obtained by data processor 11 on the basis of the acquired data. Moreover, by the restriction of a region to be photographed the number of steps in the phase encoding can be lessened. This results in further reduction in the time needed to acquire all the MR data, or the total scan time.

Although the preferred embodiment of the present invention has been disclosed and described, it is apparent that other embodiments and modifications are possible.

For example, the MR excitation and MR data acquisition of the local regions S1, S2, S3 may be performed in the order of S2, S1, S3 in accordance with their order of disposition with respect to the z axis, in place of the order of S1, S2, S3. Alternatively, the order of S2, S3, S1 may be used.

In the embodiment, on the assumption that the center of the local region is located at the center fo the magnetic field, the frequency of the corresponding high-frequency pulse is set to the center frequency of. Alternatively, the local region may be selected to position at a distance from the center of the magnetic field. The center frequency of the high frequency pulse may be set accordingly.

What is claimed is:

1. A magnetic resonance spectroscopy system comprising:
   static magnetic field applying means for applying a static magnetic field to an object under examination;
   gradient magnetic field applying means for applying gradient magnetic fields to the object;
   high frequency pulse applying means for applying a high frequency pulse including a 90° pulse to the object;

detecting means for detecting a magnetic resonance signal from the object;

control means for causing said static magnetic field applying means, said gradient magnetic field applying means, and said high frequency pulse applying means to operate in a predetermined sequence so as to induce magnetic resonance within the object; and data processing means for processing data based on the magnetic resonance signal detected by said detecting means to obtain magnetic resonance spectrum information;

said control means including local excitation control means for repeatedly performing operations of: selectively exciting, using a first gradient magnetic field and a 90° pulse, first two regions which sandwich a desired local region therebetween in a first-axis direction for a predetermined slice portion; subsequently erasing transverse magnetization components in said first two regions; selectively exciting, using a second gradient magnetic field and a 90° pulse, second two regions which sandwich said desired local region therebetween in a second-axis direction normal to the first-axis direction for said slice portion; subsequently erasing transverse magnetization components in said second two regions; and sequentially exciting at least two regions having local regions aligned in a third-axis direction intersecting said slice to acquire magnetic resonance data therefor, repeatedly using a third gradient magnetic field and a high frequency pulse within a repetition time of the excitation of said desired local region;

said data processing means obtaining a magnetic resonance spectrum of said local regions on the basis of magnetic resonance data acquired in the operations carried out by said local excitation control means.

2. A system according to claim 1, wherein said local excitation control means erases the transverse magnetization components in said first two regions by applying, immediately after the application of said 90° pulse, a spoiler pulse thereto.

3. A system according to claim 2, wherein the spoiler pulse is produced by abruptly raising the field strength in the vicinity of the trailing edge of a gradient magnetic field pulse simultaneously applied with the 90° pulse.

4. A system according to claim 1, wherein the 90° pulse is a selective excitation pulse.

5. A system according to claim 1, wherein said local excitation control means produces, as the 90° pulse for exciting said regions which sandwich said local region, a 90° pulse having frequency components corresponding to said regions.

6. A system according to claim 5, wherein the spoiler pulse is produced by abruptly raising the field strength in the vicinity of the trailing edge of a gradient magnetic field pulse simultaneously applied with the 90° pulse.

7. A system according to claim 5, wherein the 90° pulse s a selective excitation pulse.

8. A magnetic resonance spectroscopy system comprising:

static magnetic field applying means for applying a static magnetic field to an object under examination;

gradient magnetic field applying means for applying gradient magnetic fields to the object;

high frequency pulse applying means for applying a high frequency pulse including a 90° pulse to the object;

detecting means for detecting a magnetic resonance signal from the object;

control means for causing said static magnetic field applying means, said gradient magnetic field applying means, and said high frequency pulse applying means to operate in a predetermined sequence so as to induce magnetic resonance within the object; and data processing means for processing data based on the magnetic resonance signal detected by said detecting means to obtain magnetic resonance spectrum information;

said control means including local excitation control means for repeatedly performing operations of: selectively exciting, using a first gradient magnetic field and a 90° pulse, first two regions which sandwich a desired local region therebetween in a first-axis direction for a predetermined slice portion; subsequently erasing transverse magnetization components in said first two regions by applying, immediately after the application of said 90° pulse, a spoiler pulse thereto; selectively exciting, using a second gradient magnetic field and a 90° pulse, second two regions which sandwich said desired local region therebetween in a second-axis direction normal to the first-axis direction for said slice portion; subsequently erasing transverse magnetization components in said second two regions by applying, immediately after the application of said 90° pulse, the spoiler pulse thereto; exciting a region having one local region in a third-axis direction intersecting said slice to acquire magnetic resonance data therefor; and exciting a region having another local region in the third-axis direction to acquire magnetic resonance data therefor within a repetition time of the excitation of said desired local region, said spoiler pulse produced by abruptly raising the field strength in the vicinity of the trailing edge of a gradient magnetic field pulse simultaneously applied with the 90° pulse;

said data processing means obtaining a magnetic resonance spectrum of said local regions on the basis of magnetic resonance data acquired in the operations carried out by said local excitation control means.

9. A magnetic resonance spectroscopy system comprising:

static magnetic field applying means for applying a static magnetic field to an object under examination;

gradient magnetic field applying means for applying gradient magnetic fields to the object;

high frequency pulse applying means for applying a high frequency pulse including a 90° pulse to the object;

detecting means for detecting a magnetic resonance signal from the object;

control means for causing said static magnetic field applying means, said gradient magnetic field applying means, and said high frequency pulse applying means to operate in a predetermined sequence so as to induce magnetic resonance within the object; and data processing means for processing data based on the magnetic resonance signal detected by said detecting means to obtain magnetic resonance spectrum information;

said control means including local excitation control means for repeatedly performing operations of: selectively exciting first two regions which sandwich a desired local region therebetween in a first-axis direction for a predetermined slice portion, using a first gradient magnetic field and a 90° pulse having frequency components corresponding to said first two regions; subsequently erasing transverse magnetization components in said first two regions; selectively exciting second two regions which sandwich said desired local region therebetween in a second-axis direction normal to the first-axis direction for said slice portion, using a second gradient magnetic field and a 90° pulse having frequency components corresponding to said second two regions; subsequently erasing transverse magnetization components in said second two regions; exciting a region having one local region in a third-axis direction intersecting said slice to acquire magnetic resonance data therefor; and exciting a region having another local region in the third-axis direction to acquire magnetic resonance data therefor within a repetition time of the excitation of said desired local region, said spoiler pulse is produced by abruptly raising the field strength in the vicinity of the trailing edge of a gradient magnetic field pulse simultaneously applied with the 90° pulse;

said data processing means obtaining a magnetic resonance spectrum of said local regions on the basis of magnetic resonance data acquired in the operations carried out by said local excitation control means.

* * * * *